United States Patent
Zhou et al.

(10) Patent No.: US 12,199,150 B2
(45) Date of Patent: Jan. 14, 2025

(54) MULTI-LEVEL GATE DRIVER APPLIED TO SIC MOSFET

(71) Applicant: University of Electronic Science and Technology of China, Chengdu (CN)

(72) Inventors: Zekun Zhou, Chengdu (CN); Jianwen Cao, Chengdu (CN); Yue Shi, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 460 days.

(21) Appl. No.: 17/848,422

(22) Filed: Jun. 24, 2022

(65) Prior Publication Data
US 2023/0326973 A1 Oct. 12, 2023

(30) Foreign Application Priority Data
Apr. 6, 2022 (CN) .......................... 202210353030.5

(51) Int. Cl.
*H01L 29/16* (2006.01)
*H01L 29/06* (2006.01)
*H01L 29/66* (2006.01)
*H01L 29/78* (2006.01)

(52) U.S. Cl.
CPC ...... *H01L 29/1608* (2013.01); *H01L 29/0619* (2013.01); *H01L 29/66068* (2013.01); *H01L 29/782* (2013.01); *H01L 29/7821* (2013.01)

(58) Field of Classification Search
CPC ............. H01L 29/1608; H01L 29/0619; H01L 29/66068; H01L 29/782; H01L 29/7821
See application file for complete search history.

(56) References Cited

U.S. PATENT DOCUMENTS

2013/0265029 A1* 10/2013 Akiyama ............. H03K 17/162
327/109

\* cited by examiner

*Primary Examiner* — Hoa B Trinh
(74) *Attorney, Agent, or Firm* — Bayramoglu Law Offices LLC (57) ABSTRACT

A multi-level gate driver applied to the SiC metal-oxide-semiconductor field-effect transistor (MOSFET) includes three parts: the SiC MOSFET information detection circuit, the signal level shifting circuit, and the segmented driving circuit. The SiC MOSFET information detection circuit includes the SiC MOSFET drain-source voltage detection circuit and the SiC MOSFET drain-source current detection circuit. The segmented driving circuit includes a turn-on segmented driving circuit and a turn-off segmented driving circuit. The SiC MOSFET drain-source voltage detection circuit and the SiC MOSFET drain-source current detection circuit process a drain-source voltage and a drain-source current during the SiC MOSFET's switching as enable signals for segmented driving; the signal level shifting circuit transfers enable signals required by the segmented driving circuit to the suitable power supply rail; and the SiC MOSFET turn-on segmented driving circuit and the turn-off segmented driving circuit select suitable driving currents.

1 Claim, 9 Drawing Sheets

MULTI-LEVEL GATE DRIVER APPLIED TO SIC MOSFET

CROSS REFERENCE TO THE RELATED APPLICATIONS

This application is based upon and claims priority to Chinese Patent Application No. 202210353030.5, filed on Apr. 6, 2022, the entire contents of which are incorporated herein by reference.

TECHNICAL FIELD

The present invention belongs to the technical field of driving circuits for high voltage power devices, and in particular, relates to a multi-level gate driver applied to the SiC metal-oxide-semiconductor field-effect transistor (MOSFET).

BACKGROUND

In a high voltage application scenario, wide-bandgap semiconductor power devices have the characteristics of less parasitic and high heat resistance. The wide-bandgap power semiconductor devices are easier to achieve miniaturization and high frequency than Si-based power devices. Therefore, the wide-bandgap power semiconductor devices are increasingly widely used. This is also particular important for research on driving circuits of the wide-bandgap power semiconductor devices. In an application scenario of less than 600V, the Si-based power devices are dominated. In an application circuit of 600V, GaN power devices are mainly used. In an ultra-high voltage application such as greater than 1000V, SiC MOSFETs gradually replace IGBTs. With the increase of switching frequency and supply voltage, the parasitic capacitor of the wide-bandgap semiconductor power device has a big change, causing abnormal conditions such as a large overshoot current, a large overshoot voltage, and a large dv/dt and di/dt. This not only causes relatively large noise to the electronic system, but also damages related devices. Therefore, the above problems are particularly obvious for the SiC MOSFET in the high voltage application scenario. At present, most application circuits adopt a series of resistors at SiC MOSFET's gate to slow down a driving current. This manner greatly reduces a switching speed of the SiC MOSFET and does not give full play the excellent characteristics of the SiC MOSFET as much as possible. Therefore, to give full play to the characteristics of the SiC MOSFET, an active gate driver is adopted. These methods are basically implemented on the printed circuit board, which brings a relatively large parasitic effect and weakens the performance of a gate driver.

SUMMARY

To resolve the problem of existing gate drivers applied to the SiC MOSFET, the present invention provides a multi-level gate driver applied to the SiC MOSFET, which can not only reduce an overshoot current, an overshoot voltage, dv/dt, and di/dt of the SiC MOSFET but also not reduce a switching speed of the SiC MOSFET. By using a fully integrated gate driver, a related parasitic effect can be reduced. Therefore, the performance advantages of the SiC MOSFET can be brought into play.

The present invention provides a corresponding method for designing a multi-level gate driver according to the SiC MOSFET's characteristic and designs a segmented gate driving circuit applied to a SiC MOSFET based on this. The segmented gate driving circuit applied to the SiC MOSFET mainly includes three parts, which are the SiC MOSFET information detection circuit, the signal level shifting circuit, and a segmented driving circuit. The SiC MOSFET information detection circuit and the segmented driving circuit are cores of the present invention, and the signal level shifting circuit may adopt the conventional high-speed level shifting circuit. The SiC MOSFET information detection circuit includes the SiC MOSFET drain-source voltage detection circuit and the SiC MOSFET drain-source current detection circuit. The segmented driving circuit includes a turn-on segmented driving circuit and a turn-off segmented driving circuit. The SiC MOSFET drain-source voltage detection circuit and the SiC MOSFET drain-source current detection circuit process a drain-source voltage and a drain-source current during the SiC MOSFET's switching as an enable signal for segmented driving; the signal level shifting circuit transfers the enable signal to a suitable lever required by the segmented driving circuit; and the SiC MOSFET turn-on segmented driving circuit and turn-off segmented driving circuit select suitable driving currents according to the enable signal for segmented driving. Therefore, the trade-off among the switching speed, dv/dt, di/dt, and overshoot current and voltage of the SiC MOSFET can be achieved.

The present invention has the following technical solutions.

A multi-level gate driver applied to the SiC MOSFET is provided, including: the SiC MOSFET information detection circuit, the signal level shifting circuit, and the segmented driving circuit, where the SiC MOSFET information detection circuit includes the SiC MOSFET drain-source voltage detection circuit and the SiC MOSFET drain-source current detection circuit, which are respectively configured to perform sampling on information about a drain-source voltage and a drain-source current of the SiC MOSFET to obtain enable signals for segmented driving, the signal level shifting circuit is configured to transfer the enable signal for segmented driving to a level matching the segmented driving circuit and transmit the enable signal for segmented driving to the segmented driving circuit. The segmented driving circuit includes a turn-on segmented driving circuit and a turn-off segmented driving circuit and is configured to drive the SiC MOSFET according to received enable signals for segmented driving.

the SiC MOSFET drain-source voltage detection circuit includes a first NOT gate INV1_M, a second NOT gate INV2_L, a third NOT gate INV3_L, a fourth NOT gate INV4_H, a fifth NOT gate INV5, a sixth NOT gate INV6, a seventh NOT gate INV7, an eighth NOT gate INV8_L, a ninth NOT gate INV9_H, a tenth NOT gate INV10_H, an eleventh NOT gate INV11, a twelfth NOT gate INV12_L, a first AND gate AND1, a second AND gate AND2, a first Zener diode D1, a second Schottky diode D2, a third Zener diode D3, a fourth Schottky diode D4, a first latch Latch1, a second latch Latch2, a first N-metal-oxide-semiconductor (NMOS) transistor MN1, a first P-metal-oxide-semiconductor (PMOS) transistor MP1, a first delay circuit, a second delay circuit, a first rising edge detection circuit, a second rising edge detection circuit, a third rising edge detection circuit, a fourth rising edge detection circuit, a fifth rising edge detection circuit, a sixth rising edge detection circuit, a seventh rising edge detection circuit, an eighth rising edge detection circuit, a first falling edge detection circuit, a second falling edge detection circuit, and a level shifter, where input ends of the first NOT gate INV1_M, the second NOT gate INV2_L, the third NOT gate INV3_L, and the fourth NOT gate INV4_H are connected to the SiC MOSFET drain-source voltage detection circuit and a negative electrode of the first Zener diode D1, and a positive electrode of the first Zener diode D1 is grounded; an output end of the first NOT gate INV1_M is connected to an input end of the first rising edge detection circuit, and the first rising edge detection circuit outputs a first turn-on control signal; an output end of the second NOT gate INV2_L is connected to an input end of the second rising edge detection circuit, and the second rising edge detection circuit outputs a second turn-on control signal; an output end of the third NOT gate INV3_L is connected to an input end of the third rising edge detection circuit, and an output end of the fourth NOT gate INV4_H is connected to an input end of the fifth NOT gate INV5; an output end of the fifth NOT gate INV5 is connected to an input end of the fourth rising edge detection circuit, an output end of the fourth rising edge detection circuit is connected to an input end of the first delay circuit, an output end of the first delay circuit is connected to one input end of the first AND gate AND1, the other input end of the first AND gate AND1 is connected to an output end of the fifth rising edge detection circuit, an input end of the fifth rising edge detection circuit is connected to an output end of the sixth NOT gate INV6, an input end of the sixth NOT gate INV6 is connected to an output end of the level shifter, and an input end of the level shifter is connected a driving input signal; an output end of the first AND gate AND1 is connected to an R input end of the first latch Latch1, an S input end of the first latch Latch1 is connected to an output end of the first delay circuit, an output end of the first latch Latch1 is connected to an input end of the seventh NOT gate INV7, an output end of the seventh NOT gate INV7 is connected to a gate of the first PMOS transistor MP1, a source of the first PMOS transistor MP1 is grounded, a drain of the first PMOS transistor MP1 is connected to an anode of the second Schottky diode D2, and a cathode of the second Schottky diode D2 is connected to the SiC MOSFET drain-source voltage detection circuit; input ends of the eighth NOT gate INV8_L, the ninth NOT gate INV9_H, the tenth NOT gate INV10_H, and the twelfth NOT gate INV12_L and an anode of the third Zener diode D3 are connected to the SiC MOSFET drain-source voltage detection circuit, and a cathode of the third Zener diode D3 is connected to a power supply; an output end of the eighth NOT gate INV8_L is connected to the first falling edge detection circuit, and the first falling edge detection circuit outputs a first turn-off control signal; an output end of the ninth NOT gate INV9_H is connected to the second falling edge detection circuit, and an output end of the second falling edge detection circuit outputs a second turn-off control signal; an output end of the tenth NOT gate INV10_H is connected to an input end of the eleventh NOT gate INV11, and an output end of the eleventh NOT gate INV11 is connected to the sixth rising edge detection circuit; an output end of the twelfth NOT gate INV12_L is connected to an input end of the seventh rising edge detection circuit, an output end of the seventh rising edge detection circuit is connected to the second delay circuit, an output end of the second delay circuit is connected to one input end of the second AND gate AND2, the other input end of the second AND gate AND2 is connected to an output end of the eighth rising edge detection circuit, and an input end of the eighth rising edge detection circuit is connected to a driving input signal; and an output end of the second AND gate AND2 is connected to an R input end of the second latch Latch2, an S input end of the second latch Latch2 is connected to an output end of the sixth rising edge detection circuit, an output end of the second latch Latch2 is connected to a gate of the first NMOS transistor MN1, a source of the first NMOS transistor MN1 is grounded, a drain of the first NMOS transistor MN1 is connected to a cathode of the fourth Schottky diode D4, and an anode of the fourth Schottky diode D4 is connected to the SiC MOSFET drain-source voltage detection circuit;

the SiC MOSFET drain-source current detection circuit includes a thirteen NOT gate INV13, a fourteenth NOT gate INV14, a fifteenth NOT gate INV15, a sixteenth NOT gate INV 16, a seventeenth NOT gate INV17, a first Schmitt trigger SMIT1, a fifth Zener diode D5, a sixth Zener diode D6, a third latch Latch3, a third AND gate AND3, a ninth rising edge detection circuit, a tenth rising edge detection circuit, an eleventh rising edge detection circuit, and a divide-by-two circuit, where an input end of the thirteen NOT gate INV13, an input end of the sixteenth NOT gate INV16, an anode of the fifth Zener diode D5, and a cathode of the sixth Zener diode D6 are connected to the SiC MOSFET drain-source current detection circuit, a cathode of the fifth Zener diode D5 is connected to the power supply, and an anode of the sixth Zener diode D6 is grounded; an output end of the thirteen NOT gate INV13 is connected to an input end of the fourteenth NOT gate INV14, an output end of the fourteenth NOT gate INV14 is connected to a clock signal input end of the divide-by-two circuit, and a reset signal end of the divide-by-two circuit is connected to an output end of the third latch Latch3; an S input end of the third latch Latch3 is connected to an output end of the ninth rising edge detection circuit, and an R input end of the third latch Latch3 is connected to an output end of the tenth rising edge detection circuit; an input end of the ninth rising edge detection circuit is connected to a driving input signal, and an input end of the tenth rising edge detection circuit is connected to an output end of the third AND gate AND3; an output end of the divide-by-two circuit is connected to an input end of the eleventh rising edge detection circuit, an output end of the eleventh rising edge detection circuit is connected to an input end of the fifteenth NOT gate INV15, an output end of the fifteenth NOT gate INV15 is connected to one input end of the third AND gate AND3, the other input end of the third AND gate AND3 is connected to an output end of the third latch Latch3, and the third AND gate AND3 outputs a third turn-on control signal; and an output end of the sixteenth NOT gate INV16 is connected to an input end of the first Schmitt trigger SMIT1, an output end of the first Schmitt trigger SMIT1 is connected to an input end of the seventeenth NOT gate INV17, and an output end of the seventeenth NOT gate INV17 outputs a third turn-off control signal;

the first turn-on control signal, the second turn-on control signal, third turn-on control signal, the first turn-off control signal, the second turn-off control signal, the third turn-off control signal, and an externally inputted control signal form the enable signal for segmented driving, the signal level shifting circuit includes upward shifting and downward shifting, and a first high-level turn-on control signal, a second high-level turn-on control signal, a third high-level turn-on control signal, a high-level externally inputted control signal, a first low-level turn-off control signal, a second low-level turn-off control signal, a third low-level turn-off control signal, and a low-level externally inputted control signal are obtained after the enable signal for segmented driving passes through the signal level shifting circuit;

the SiC MOSFET turn-on stage segmented driving circuit includes an eighteenth NOT gate INV18, a nineteenth NOT gate INV19, a twentieth NOT gate INV20, a twenty-first NOT gate INV21, a twenty-second NOT gate INV22, a twenty-third NOT gate INV 23, a twenty-fourth NOT gate INV24, a twenty-fifth NOT gate INV 25, a twenty-sixth NOT gate INV26, a first OR-NOT gate NOR1, a fourth AND gate AND4, a first AND-NOT gate NAND1, a second AND-NOT gate NAND2, a fourth latch Latch4, a fifth latch Latch5, a first p-type lateral diffused metal oxide semiconductor (PLDMOS) transistor PLD1, a second PLDMOS transistor PLD2, a third PLDMOS transistor PLD3, and a twelfth rising edge detection circuit, where an input end of the nineteenth NOT gate INV19 is connected to the high-level externally inputted control signal, and an output end of the nineteenth NOT gate INV19 is connected to one input end of the first OR-NOT gate NOR1 and an R input end of the fifth latch Latch5; the other input end of the first OR-NOT gate NOR1 is connected to an output end of the eighteenth NOT gate INV18, and an output end of the first OR-NOT gate NOR1 is connected to an R input end of the fourth latch Latch4; an input end of the eighteenth NOT gate INV18 is connected to the first high-level turn-on control signal; an S input end of the fourth latch Latch4 is connected to an output end of the twelfth rising edge detection circuit, and an input end of the twelfth rising edge detection circuit is connected to the third high-level turn-on control signal; an input end of the twenty-second NOT gate INV22 is connected to an output end of the fourth latch Latch4, an output end of the twenty-second NOT gate INV22 is connected to one input end of the first AND-NOT gate NAND1, the other input end of the first AND-NOT gate NAND1 is connected to an output end of the twenty-first NOT gate INV21, an output end of the first AND-NOT gate NAND1 is connected to an input end of the twenty-third NOT gate INV23, an output end of the twenty-third NOT gate INV23 is connected to an input end of the twenty-fourth NOT gate INV24, an output end of the twenty-fourth NOT gate INV24 is connected to a gate of the first PLDMOS transistor PLD1, and a source of the first PLDMOS transistor PLD1 is connected to the power supply; an S input end of the fifth latch Latch5 is connected to the second high-level turn-on control signal, an output end of the fifth latch Latch5 is connected to one input end of the second AND-NOT gate NAND2, the other input end of the second AND-NOT gate NAND2 is connected to an output end of the fourth AND gate AND4, an output end of the second AND-NOT gate NAND2 is connected to an input end of the twenty-fifth NOT gate INV25, an output end of the twenty-fifth NOT gate INV25 is connected to an input end of the twenty-sixth NOT gate INV26, an output end of the twenty-sixth NOT gate INV26 is connected to a gate of the third PLDMOS transistor PLD3, and a source of the third PLDMOS transistor PLD3 is connected to the power supply; one input end of the fourth AND gate AND4 is connected to the high-level externally inputted control signal, the other input end of the fourth AND gate AND4 is connected to the SiC MOSFET turn-on stage deadband signal, and the output end of the fourth AND gate AND4 is connected to an input end of the twentieth NOT gate INV20; and an output end of the twentieth NOT gate INV20 is connected to an input end of the twenty-first NOT gate INV21 and a gate of the second PLDMOS transistor PLD2, and a source of the second PLDMOS transistor PLD2 is connected to the power supply; and the SiC MOSFET turn-off stage segmented driving circuit includes a twenty-seventh NOT gate INV27, a twenty-eighth NOT gate INV28, a twenty-ninth NOT gate INV29, a thirtieth NOT gate INV30, a thirty-first NOT gate INV31, a thirty-second NOT gate INV32, a thirty-third NOT gate INV33, a thirty-fourth NOT gate INV34, a second OR-NOT gate NOR2, a third OR-NOT gate NOR3, a third AND-NOT gate NAND3, a fifth AND gate AND5, a sixth AND gate AND6, a seventh AND gate AND7, a sixth latch Latch6, a seventh latch Latch7, an eighth latch Latch8, a first n-type laterally diffused metal-oxide-semiconductor (NLDMOS) transistor NLD1, a second NLDMOS transistor NLD2, a third NLDMOS transistor NLD3, a third delay circuit, a third falling edge detection circuit, a fourth falling edge detection circuit, and a thirteenth rising edge detection circuit, where one input end of the second OR-NOT gate NOR2 is connected to the second low-level turn-off control signal, the other input end of the second OR-NOT gate NOR2 is connected to the low-level externally inputted control signal, an output end of the second OR-NOT gate NOR2 is connected to an input end of the twenty-seventh NOT gate INV27, and an output end of the twenty-seventh NOT gate INV27 is connected to an R input end of the sixth latch Latch6; an S input end of the sixth latch Latch6 is connected to the first low-level turn-off control signal, an output end of the sixth latch Latch6 is connected to an input end of the third delay circuit, an input end of the third falling edge detection circuit, and an input end of the thirtieth NOT gate INV30, an output end of the thirtieth NOT gate INV30 is connected to one input end of the sixth AND gate AND6, the other input end of the sixth AND gate AND6 is connected to an output end of the third OR-NOT gate NOR3, an output end of the sixth AND gate AND6 is connected to an input end of the thirty-first NOT gate INV31, an output end of the thirty-first NOT gate INV31 is connected to an input end of the thirty-second NOT gate INV32, an output end of the thirty-second NOT gate INV32 is connected to a gate of the first NLDMOS transistor NLD1, and a source of the first NLDMOS transistor NLD1 is grounded; an input end of the thirteenth rising edge detection circuit is connected to an output end of the third delay circuit, an output end of the thirteenth rising edge detection circuit is connected to an input end of the twenty-eighth NOT gate INV28, an output end of the twenty-eighth NOT gate INV28 is connected to one input end of the fifth AND gate AND5, the other input end of the fifth AND gate AND5 is connected to an output end of the third AND-NOT gate NAND3, one input end of the third AND-NOT gate NAND3 is connected to an output end of the seventh latch Latch7, and the other input end of the third AND-NOT gate NAND3 is connected to an output end of the fourth falling edge detection circuit; an input end of the fourth falling edge detection circuit is connected to the third low-level turn-off control signal; an S input end of the seventh latch Latch7 is connected to an output end of the third falling edge detection circuit, and an R input end of the seventh latch Latch7 is connected to the low-level externally inputted control signal; an output end of the fifth AND gate AND5 is connected to an S input end of the eighth latch Latch8, an R input end of the eighth latch Latch8 is connected to an output end of the twenty-ninth NOT gate INV29, and an input end of the twenty-ninth NOT gate INV29 is connected to the low-level externally outputted control signal; one input end of the seventh AND gate AND7 is connected to an output end of the eighth latch Latch8, the other input end of the seventh AND gate AND7 is connected to an output end of the third OR-NOT gate NOR3, an output end of the seventh AND gate AND7 is connected to an input end of the thirty-third NOT gate INV33, an output end of the thirty-third NOT gate INV33 is connected to an input end of the thirty-fourth NOT gate INV34, an output end of the thirty-fourth NOT gate INV34 is connected to a gate of the third NLDMOS transistor NLD3, and a source of the third NLDMOS transistor NLD3 is grounded; a gate of the second NLDMOS transistor NLD2 is connected to an output end of the third OR-NOT gate NOR3, and a source of the second NLDMOS transistor NLD2 is grounded; and a drain of the first PLDMOS transistor PLD1, a drain of the second PLDMOS transistor PLD2, a drain of the third PLDMOS transistor PLD3, a drain of the first NLDMOS transistor NLD1, a drain of the second NLDMOS transistor NLD2, and a drain of the third NLDMOS transistor NLD3 are connected as an output end of the segmented driving circuit.

The present invention has the beneficial effect of resolving a problem that a response speed, dv/dt, di/dt, and overshoot current and voltage of a conventional SiC MOSFET driving circuit are not considered simultaneously. By using the segmented driving circuit, a switching speed of the SiC MOSFET is improved as much as possible when dv/dt, di/dt, and the overshoot current and voltage of the SiC MOSFET are reduced.

DETAILED DESCRIPTION OF THE EMBODIMENTS

The present invention is further described below with reference to the accompanying drawings.

Figure 1:
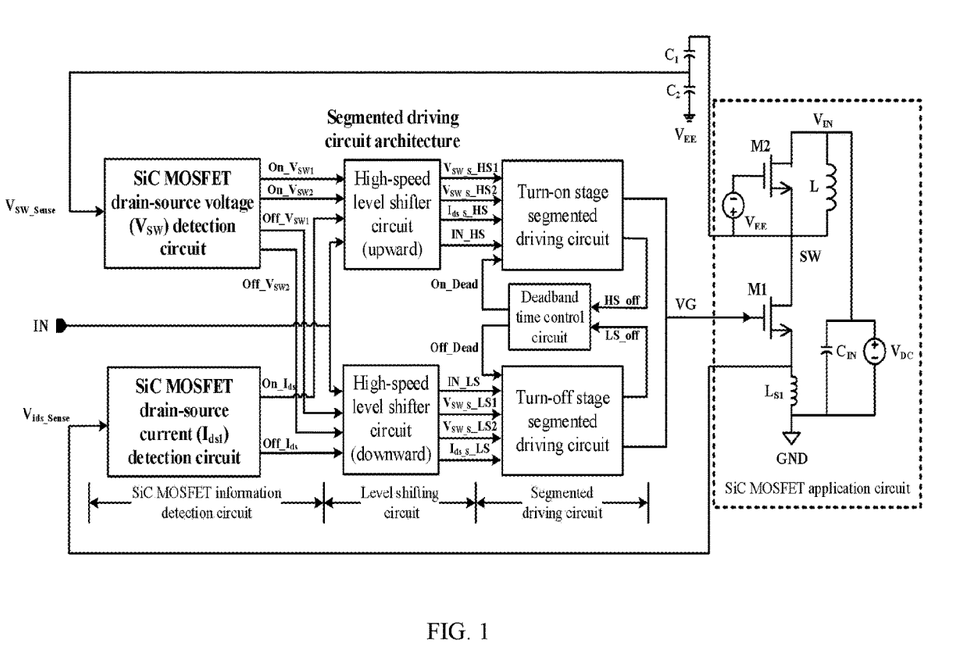
FIG. 1 is an architecture diagram of the multi-level gate driver based on the SiC MOSFET according to the present invention.

FIG. 1 is an architecture diagram of a multi-level gate driver applied to the SiC MOSFET according to the present invention. To simulate a switching status of the SiC MOSFET in a half-bridge structure, an application circuit shown in FIG. 1 is used. The multi-level gate driver provided in the present invention drives a first SiC MOSFET M1. A parasitic diode of a second SiC MOSFET M2, as a freewheeling diode, is in a constant turn-on state. Main parasitic parameters of the SiC MOSFET are listed in FIG. 1. When the first SiC MOSFET M1 is turned on, a current on an inductor L flows into M1. When the first SiC MOSFET M1 is turned off, a body diode of the second SiC MOSFET M2 is freewheeled. A gate-source capacitance Cgs of the SiC MOSFET is a constant value, a drain-source capacitance Cds is reduced with the increase of voltages at two ends of the SiC MOSFET, and a gate-drain capacitance Cgd is reduced sharply with the increase of the voltages at two ends of the SiC MOSFET. In FIG. 1, a parasitic inductor is introduced by encapsulation. At a turn-on stage, a drain-source capacitance Cds2 of the second SiC MOSFET M2 is reduced with the reduction of $V_{SW}$. $dV_{SW}/dt$ depends on the drain-source capacitance Cds2 of the second SiC MOSFET M2, a sum of a drain-source capacitance Cds1 and a gate-drain capacitance Cgd1 of the first SiC MOSFET M1, and a gate-source voltage Vgs1 of the first SiC MOSFET. At a turn-off stage, an overshoot of $V_{SW}$ depends on parasitic inductances $L_{D2}$ and $L_{S2}$ of the second SiC MOSFET M2. Similarly, $dV_{SW}/dt$ depends on the drain-source capacitance Cds2 of the second SiC MOSFET M2, the sum of the drain-source capacitance Cds1 and the gate-drain capacitance Cgd1 of the first SiC MOSFET M1, and the gate-source voltage of the first SiC MOSFET. By adjusting a driving current, the gate-source voltage Vgs1 of the first SiC MOSFET is controlled, and then $dV_{SW}/dt$, $d_{Ids}/dt$, and overshoot current and voltage are controlled. A change rate of a drain-source current $I_{ds}$ of the first SiC MOSFET is detected by using a voltage drop $V_{Ids}$ Sense on a source parasitic inductor $L_{S1}$ of the first SiC MOSFET M1. That is, $$V_{ids\_Sense} = L_{S1} \times \frac{d_{I_{ds1}}}{dt}$$

Therefore, a switching status of the first SiC MOSFET M1 is fed back to the segmented driving circuit according to $V_{LS1}$. A high-voltage first capacitor C1 and a high-voltage second capacitor C2 feedback a change condition of $V_{SW}$ to the segmented driving circuit. The driving circuit determines a magnitude of a driving current according to information about a drain-source voltage and a drain-source current of the first SiC MOSFET M1. Based on this, the driving current may be fed back to A driving control circuit in real time according to an operating condition of the SiC MOSFET, and further the magnitude of the driving current is adjusted, to control a switching speed of the SiC MOSFET.

Figure 2:
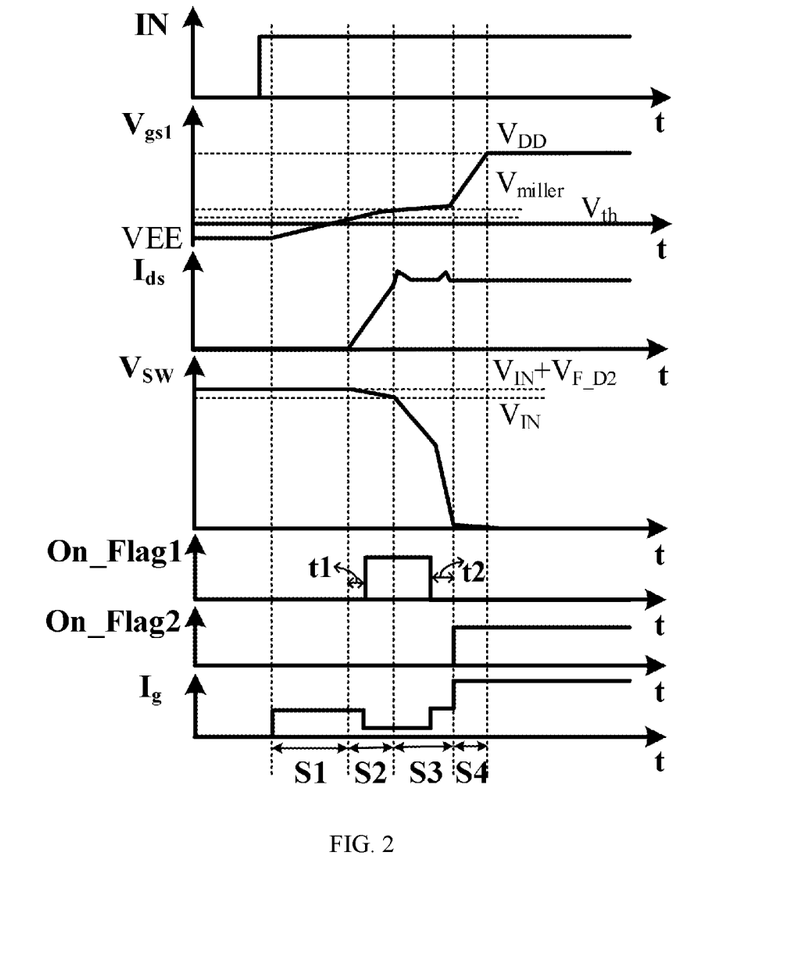
FIG. 2 is a method for designing a turn-on segmented driving circuit based on the SiC MOSFET according to the present invention.

FIG. 2 is a method for designing a turn-on segmented driving circuit based on the SiC MOSFET. At S1 and S2 stages, Vgs1 rises from VEE to a Miller platform stage, and a moderate driving current is adopted, so that a change speed of a current generated by a channel of the SiC MOSFET can be reduced, that is, $d_{Ids}/dt$ can be controlled. A relatively high driving current indicates the fast rising-speed of Vgs1, and a relatively high di/dt signal cannot be fed back in time by using a feedback mechanism, which is easy to cause damage to a device. Because when Ids does not rise to $I_L$, a relatively small driving current is used to increase a turn-on time of the SiC MOSFET, and the turn-on time of the SiC MOSFET and $d_{Ids}/dt$ need to be set in a reasonable range by controlling t1. Therefore, at a first stage, that is, S1, a constant driving current is used. At a second stage, that is, S2, whether to reduce the driving current is determined by using a drain-source current Ids of the first SiC MOSFET M1, that is, a rising edge of On_Flag1. In addition, the driving current may be adjusted according to external application. At a S3 stage, an overshoot current depends on a current on Cds2. When $V_{SW}$ is equal to VIN, Cds2 is the largest, and even a small $dV_{SW}/dt$ is easy to produce a relatively large overshoot current ΔIds. In this case, Vgs1 should maintain a small value, that is, a low driving current Ig is used. With the reduction of $V_{SW}$, Cds2 is sharply reduced, and a rising speed of Vgs1 may be appropriately accelerated within an allowable range. Because $dV_{SW}/dt$ has a certain limitation and also produces the overshoot current ΔIds, the driving current Ig may be appropriately increased, but a maximum driving current Ig cannot be used. At this stage, when $V_{SW}$ is reduced in segments, the trade-off between a falling speed of VSW and $dV_{SW}/dt$ can be achieved by controlling t2. At this stage, a falling edge of On_Flag1 may be determined by using $V_{SW}$, and whether the driving current needs to be increased is determined. At a S4 stage, when the SiC MOSFET enters a linear region, the maximum driving current Ig may be used to charge Vgs1 to VDD. When a supply voltage of the driving circuit is equal to VDD, even if the maximum driving current is used, Vgs 1 is close to VDD, a driving transistor has entered the linear region, and an actual driving current is not excessive high. In this way, a rising speed of Vgs1 can still be accelerated without causing excessive high dv/dt of Vgs1. At this stage, whether the maximum driving current is used may be determined depending on whether $V_{SW}$ is close to a ground potential, that is, On_Flag2, so that the first SiC MOSFET M1 is turned on.

Figure 3:
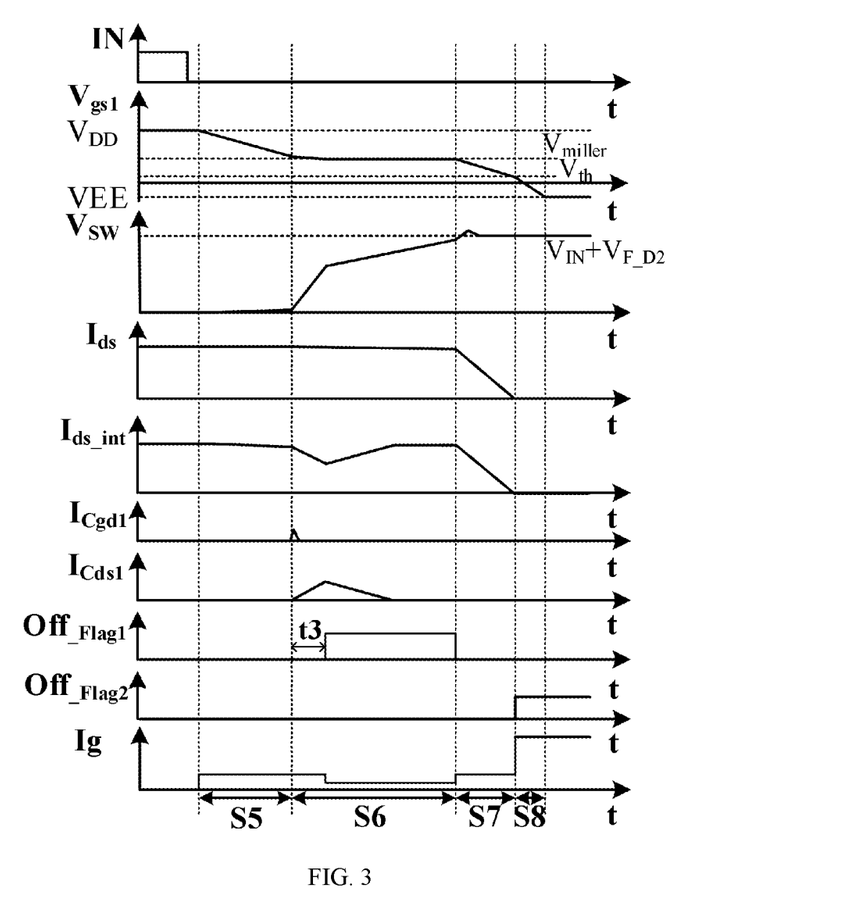
FIG. 3 is a method for designing a turn-off multi-level driving circuit based on the SiC MOSFET according to the present invention.

FIG. 3 is a method for designing a turn-on segmented driving circuit based on the SiC MOSFET. At S5 and S6 stages, a relatively small driving current Ig is used, a falling speed of Vgs1 of the first SiC MOSFET M1 is also reduced, and a falling speed of a current of the channel is also reduced. Therefore, a rising speed of $V_{SW}$ is slower. When the current Ids_int of the channel of the first SiC MOSFET M1 is reduced to a specific value, $V_{SW}$ starts rising. In this case, a gate driving current Ig is reduced to a minimum value, and the falling speed of Vgs1 of the first SiC MOSFET M1 is the slowest. With the increase of $V_{SW}$, Ids_int is increased and gradually approaches Ids_int. The rising speed of $V_{SW}$ is slow down, and a current on a parasitic capacitor of the first SiC MOSFET M1 is reduced. Whether a relatively small driving current is used may be determined by using a voltage value of $V_{SW}$, that is, an Off_Flag1 signal. Alternatively, $dV_{SW}/dt$ may be controlled into a set range by adjusting the magnitude of the driving current. At a S7 stage, after $V_{SW}$ is close to VIN, the gate driving current may be increased appropriately, the gate-source voltage Vgs1 of the first SiC MOSFET M1 starts to reduce, and Ids and Ids_int are reduced simultaneously. In this case, the current on the parasitic capacitor is ignored because $V_{SW}$ is greater than VIN and the change speed is relatively small. A falling speed of Ids is also a rising speed of a positive turn-on current of a body diode of the second SiC MOSFET M2. Therefore, in this case, the falling speed of the gate-source Vgs1 of the first SiC MOSFET still needs to be controlled, to control the falling speed of Ids. Therefore, overshoots of $d_{Ids}/dt$ and $V_{SW}$ may be controlled. A larger difference between Ids and the current Ids_int of the channel of the first SiC MOSFET M1 indicates a larger dv/dt, and a shorter time required by rising of $V_{SW}$. At this stage, the trade-off between dv/dt and the turn-on time may be achieved by adjusting a time t3. At a S8 stage, when Ids is reduced to 0, the gate-source voltage Vgs1 of the first SiC MOSFET M1 may be quickly pulled to VEE to complete a turn-off process of the SiC MOSFET. That is, in this case, the gate driving current is a maximum value. Whether the maximum driving current is used may be determined depending on whether the drain-source current Ids of the first SiC MOSFET M1 is turned off, that is, Off_Flag2.

The foregoing is the method for designing SiC MOSFET-based segmented driving circuit. The circuit is designed according to the method. An implementation of SiC MOSFET-based segmented driving circuit is described below in detail with reference to FIG. 4 to FIG. 9.

Figure 4:
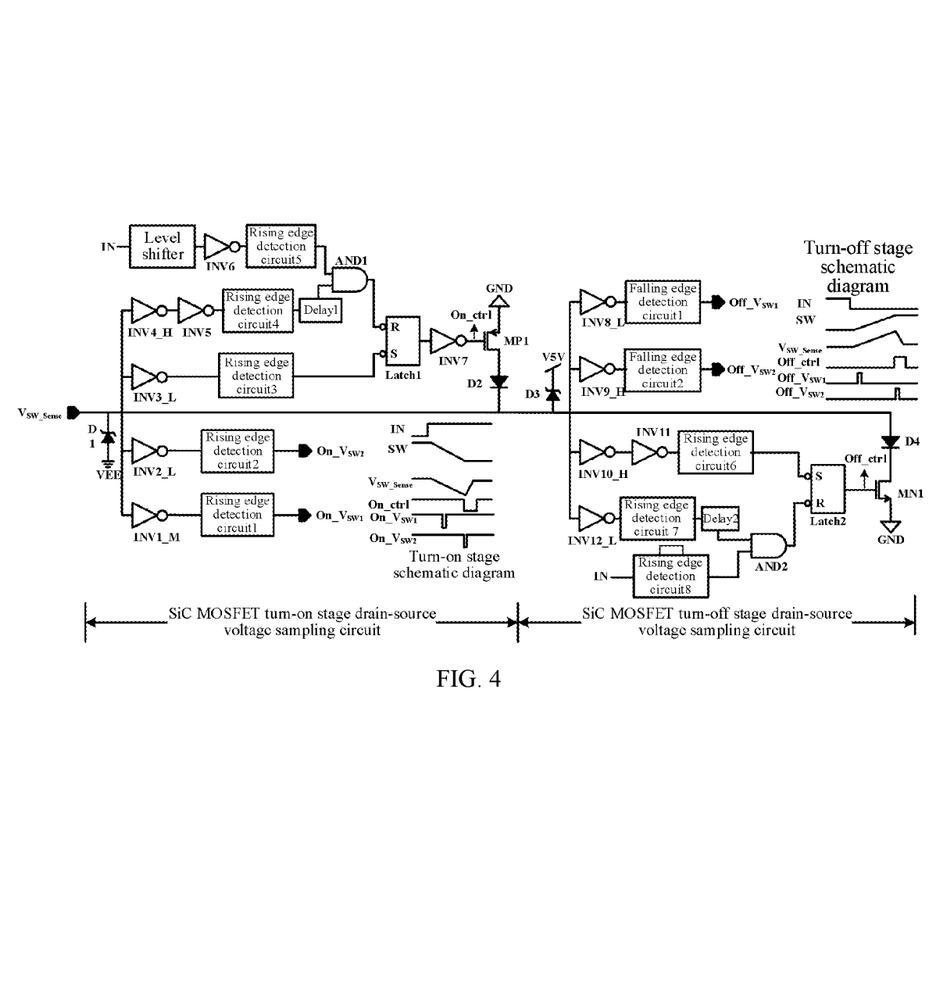
FIG. 4 is the SiC MOSFET drain-source voltage information detection circuit according to the present invention.

FIG. 4 is the SiC MOSFET drain-source voltage detection circuit. When a first SiC MOSFET is turned on or turned off, $V_{SW}$ sense is restored to GND after detecting a change of $V_{SW}$, so that the change of $V_{SW}$ is detected next time. When the first SiC MOSFET M1 is turned on, $V_{SW}$ and $V_{SW\_Sense}$ are reduced. A first NOT gate INV1_M to a fourth NOT gate INV4_H are used as comparators, and a flipped voltage is determined by setting a flipped voltage of a NOT gate. When $V_{SW\_Sense}$ is reduced to a middle point between VEE and GND, the first NOT gate INV1_M is flipped, and a first rising edge detection circuit works, and an output signal On_$V_{SW1}$ is changed to a low level short pulse. When $V_{SW\_Sense}$ is continuously reduced to a lowest point, the second NOT gate INV2_L and the third NOT gate INV3_L are flipped, a second rising edge detection circuit and a third rising edge detection circuit work, and an output signal On_$V_{SW2}$ is changed into a low level short pulse. A first latch Latch1 works and a signal On_ctrl is flipped to VEE, and a first PMOS transistor is turned on, and $V_{SW\_Sense}$ is pulled to (GND-VF). When $V_{SW\_Sense}$ rises, the fourth NOT gate INV4_H is flipped, and the first latch 1 works after a specific delay. When On_Ctrl is flipped from VEE to GND, and the first PMOS transistor MP1 is turned off. A first delay circuit is used to ensure that $V_{SW\_Sense}$ is restored to near GND, so that the change of $V_{SW}$ is detected next time. A first Zener diode D2 is used to ensure that $V_{SW\_Sense}$ is not reduced indefinitely, and a second Schottky diode D2 is used to prevent a current of the first PMOS transistor MP1 from backflow when $V_{SW\_Sense}$ is greater than GND. A power rail used by a turn-on stage drain-source voltage sampling circuit of the SiC MOSFET in FIG. 2 is GND to VEE, where GND is 0V, and VEE is −5V When the first SiC MOSFET M1 is turned off, $V_{SW}$ rises, and $V_{SW\_Sense}$ also rises. An eighth NOT gate INV8_L to a tenth NOT gate INV10_H and a twelfth NOT gate INV12_L are also used as comparators, and a flipped voltage is determined by setting a flipped voltage of a NOT gate. When $V_{SW}$ sense rises, the eighth NOT gate INV8_L is flipped, a first falling edge detection circuit works and a signal Off_$V_{SW1}$ is outputted as a high level short pulse. When $V_{SW\_Sense}$ continuously rises to the highest, the ninth NOT gate INV9_H is flipped, a second falling edge detection circuit works, and a signal Off_$V_{SW2}$ is outputted as a high level short pulse. In addition, the tenth NOT gate INV10_H is flipped, and an eleventh NOT gate INV11 and a sixth rising edge detection circuit work, a second latch Latch2 works, Off_Ctrl rises from GND to V5V, and a first NMOS transistor MN1 is turned on. When $V_{SW}$ sense starts to reduce and is reduced to a minimum value, the twelfth NOT gate INV12_L is flipped, a seventh detection circuit, a second delay circuit, and a second AND gate work, a second latch Latch2 outputs a low level signal, Off_ctrl is flipped to GND, and the first NMOS transistor MN1 is turned off. A second delay circuit is used to ensure that $V_{SW\_Sense}$ is restored to near GND, so that the change of $V_{SW}$ is detected next time. A third Zener diode D3 is used to ensure that $V_{SW\_Sense}$ does not rise indefinitely. A fourth Schottky diode D4 is used to prevent a current of the first PMOS transistor MP1 from backflow when $V_{SW\_Sense}$ is greater than GND. A power rail used by a turn-off stage drain-source voltage sampling circuit of the SiC MOSFET in FIG. 4 is GND to V5V, where GND is 0V, and V5V is 5V. In FIG. 4, a rising edge detection circuit or a falling edge detection circuit is used because the switching speed of the SiC MOSFET is relatively fast. The detected $V_{SW}$ sense may partially coincide with a subsequent current sampling voltage pulse, which may cause spurious triggering and even chaos on a subsequent circuit.

Figure 5:
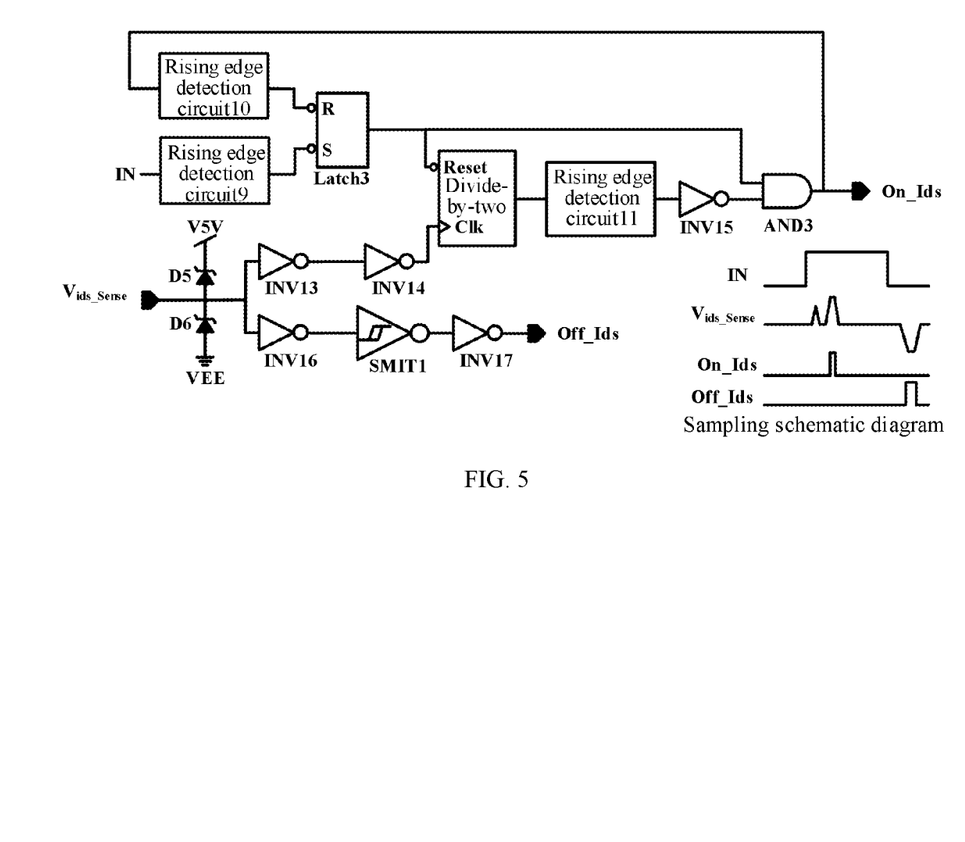
FIG. 5 is the SiC MOSFET drain-source current information detection circuit according to the present invention.

FIG. 5 is the SiC MOSFET drain-source current detection circuit. It can be learned from FIG. 1 that $$V_{Ids\_Sense} = L_{S1} \times \frac{d(I_q + I_{ds1})}{dt}$$

when the first SiC MOSFET is turned on, IN is flipped to a high level, a ninth rising edge detection circuit works, a third latch Latch3 outputs a high level signal, and a divide-by-two circuit works normally. When the driving circuit starts outputting a gate driving current Ig, although the drain-source current Ids of the first SiC MOSFET M1 is 0, $V_{Ids\_Sense}$ is overshoot. After Ig is stable, $V_{Ids}$ sense is restored to GND. When the first SiC MOSFET M1 has the drain-source current Ids, $V_{Ids}$s sense rises again, a thirteen NOT gate INV13 and a fourteen NOT gate INV14 are flipped, the divide-by-two circuit makes a response to output a high level signal, and an eleventh rising edge detection circuit, a fifteen NOT gate INV15, and a third AND gate work, to cause an output signal On_Ids to be flipped to a high level. When On_Ids is flipped to the high level, a tenth rising edge detection circuit works, a third latch Latch3 outputs a low level signal, and the divide-by-two circuit fails, to wait for detecting turn-on of the SiC MOSFET in a next cycle. When the first SiC MOSFET M1 is turned off, information about the drain-source current of the first SiC MOSFET M1 is transmitted to a signal Off Ids by using a sixteen NOT gate INV16, a first Schmitt trigger SMIT1, and a seventeen NOT gate INV17. A fifth Zener transistor D5 and a sixth Zener transistor D6 are used to clamp $V_{Ids\_Sense}$ within an appropriate voltage range, to prevent excessive voltage from damaging an internal circuit. A power rail of an effective voltage of $V_{Ids\_Sense}$ at a turn-on stage of the first SiC MOSFET M1 is GND to V5V. Therefore, a corresponding logical signal is processed herein. The power rail of the effective voltage of $V_{Ids\_Sense}$ at a turn-off stage of the first SiC MOSFET M1 is VEE to GND. A corresponding logical signal is processed subsequently, otherwise, a level shifter circuit needs to be added, to increase a chip area. Because $V_{Ids\_Sense}$ may be a positive voltage or may be a negative voltage, gate-source voltages of devices used by the thirteenth NOT gate INV13 and the fourteenth NOT gate INV14 need to withstand positive and negative voltages.

Figure 6:
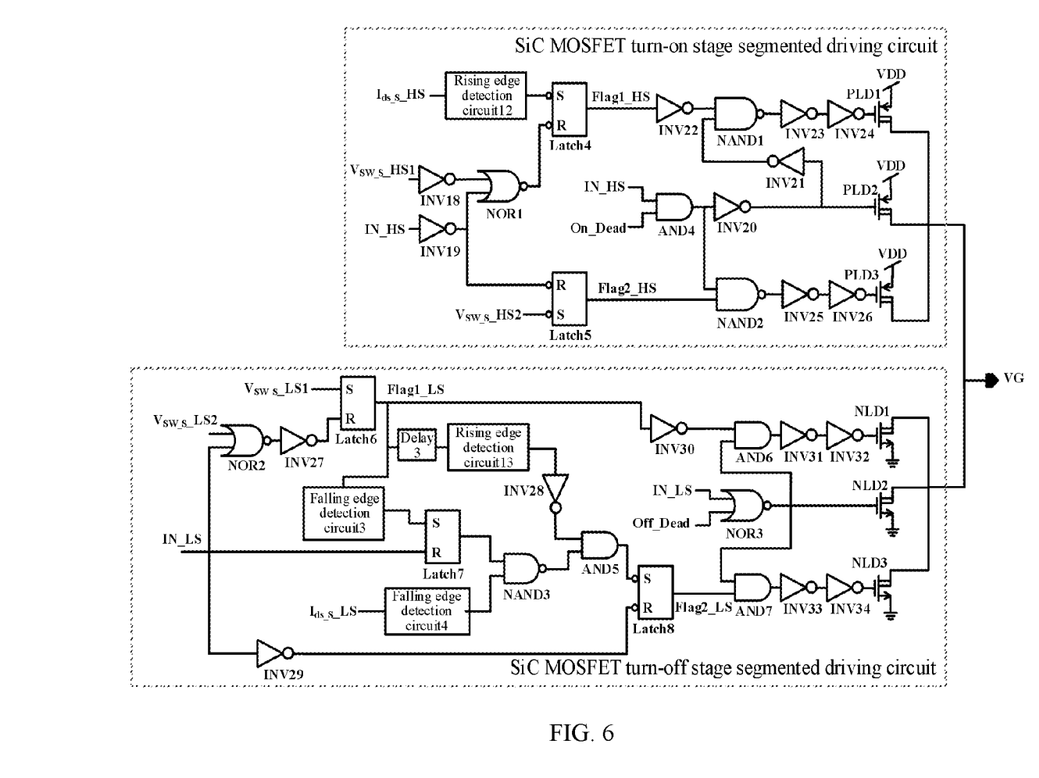
FIG. 6 is the SiC MOSFET segmented driving circuit according to the present invention.
Figure 7:
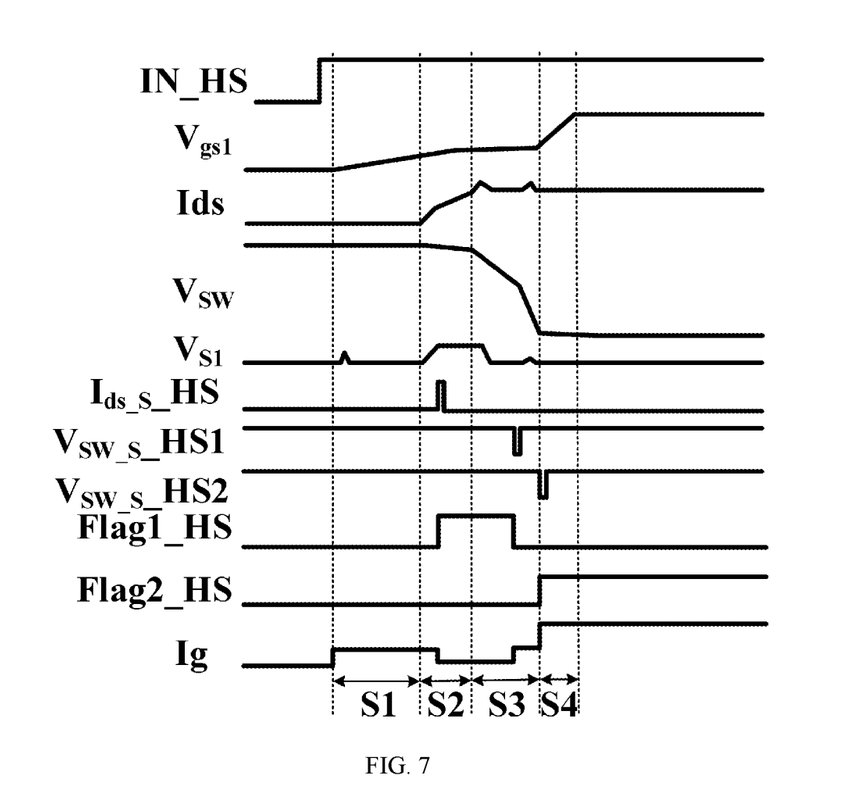
FIG. 7 is the SiC MOSFET turn-on segmented driving key signal waveform according to the present invention.
Figure 8:
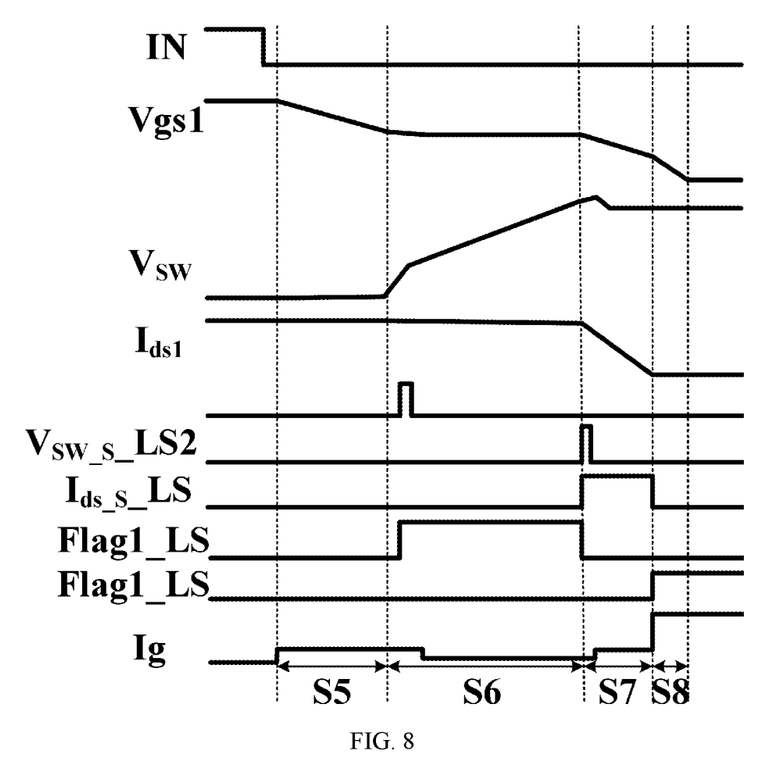
FIG. 8 is the SiC MOSFET turn-off multi-level driving key signal waveform according to the present invention.

FIG. 6 is the SiC MOSFET segmented driving circuit. FIG. 7 and FIG. 8 are schematic diagrams of key nodes of the segmented driving circuit. First, a working principle of the SiC MOSFET turn-on segmented driving circuit is described. In FIG. 6, a power rail used by a turn-on circuit is VDD and VSSH, where VDD is 15V, and VSSH is 10V The turn-on stage may be divided into four working processes. An operating condition of a driving circuit at each stage is analyzed in detail below with reference to FIG. 6 and FIG. 7.

At a S1 stage: when both an input signal IN_HS and a turn-on deadband signal On_Dead are at a high level, a fourth AND gate AND4 outputs a high level signal, a twentieth NOT gate INV20 outputs a low level signal, and a second PLDMOS transistor PLD2 outputs a specific driving current. When the first SiC MOSFET is not turned on, Flag1_HS is always a low level signal. Therefore, after a second PLDMOS transistor PLD2 is turned on, a first PLDMOS transistor PLD1 is turned on through a twenty-first NOT gate INV21, a first AND-NOT gate NAND1, a twenty-third NOT gate INV23, and a twenty-fourth NOT gate INV24, to increase the driving current. The process is shown in the S1 stage in FIG. 4. At this stage, the driving current is turned on in segments. This mainly because a gate parasitic inductance of the SiC MOSFET is relatively large, and the current changes too fast, which is easy to cause a large voltage difference at two ends of the parasitic inductance, resulting in more serious oscillation.

At a S2 stage: after the SiC MOSFET is turned on, the drain-source current Ids starts rising, a drain-source current detection circuit of the SiC MOSFET works, and $I_{ds\_s}$_HS after passing through a level shifter circuit is a high level pulse circuit. After a twelfth rising edge detection circuit works, an S end of a fourth latch Latch4 outputs a low level pulse signal, and the fourth latch Latch4 outputs a high level signal Flag1_HS. The first PLDMOS transistor PLD1 is turned off through a twenty-second NOT gate INV22, the first AND-NOT NAND1, the twenty-third NOT gate INV23, and the twenty-fourth NOT gate INV24, to reduce the driving current. In this case, a rising speed of the gate-source voltage Vgs1 of the first SiC MOSFET M1 is slow down, and a falling speed of $V_{SW}$ is also slow down.

At a S3 stage: because $dV_{SW}/dt$ is reduced, an overshoot of Ids is also reduced. With the reduction of $V_{SW}$, a low level pulse signal occurs at $V_{SW\_S}$_HS1. After passing through an eighteen NOT gate INV18 and a first OR-NOT gate NOR1, an R end of the fourth latch Latch4 generates a low level signal, Flag1_HS is flipped from high level to low level, and the first PLDMOS transistor PLD1 is turned on again, to increase the driving current. At a $V_{SW}$ reduction stage, two segments of driving current are adopted. This is because Cds2 is reduced rapidly with the reduction of $V_{SW}$. If the driving current and a falling rate of $V_{SW}$ are appropriately increased, Ids does not cause too much overshoot.

At a S4 stage: when $V_{SW}$ is reduced to a linear region of the first SiC MOSFET M1, the $V_{SW}$ has a low potential. In this case, VSW_S_HS2 has a low level pulse signal, an S end of a fifth latch Latch5 is at a low level, Flag2_HS is at a high level, a third PLDMOS transistor PLD3 is turned on through the second AND-NOR gate NAND2, a twenty-fifth NOT gate INV25, and a twenty-sixth NOT gate INV26, to output a maximum driving current, to rapidly pull the gate-source voltage Vgs1 of the first SiC MOSFET M1 to VDD, thereby completing a turn-on action of the SiC MOSFET.

When IN_HS is flipped from a high level to a low level, Flag1_HS and Flag2_HS are restored to a low level by using a nineteen NOT gate INV19. This is to prevent other subsequent logic errors caused by the misoperation of the drain-source detection circuit of the SiC MOSFET in a cycle. In the turn-on stage segmented driving circuit, the second PLDMOS transistor PLD2 outputs a minimum driving current, the first PLDMOS transistor PLD1 output a moderate driving current, and the third PLDMOS transistor PLD3 outputs a maximum driving current. Segmented driving is implemented by adjusting three different levels of driving current.

In FIG. 6, a power rail used by a turn-off stage segmented driving circuit is GND and VEE, where GND is 0V, and VEE is −5V The turn-off stage may also be divided into four working processes. An operating condition of a driving circuit at each stage is analyzed in detail below with reference to FIG. 6 and FIG. 8.

At a S5 stage: when both an input signal IN_LS and a turn-off deadband signal Off_Dead are at a low level, a third OR-AND gate NOR3 outputs a high level signal, a second NLDMOS transistor NLD2 is turned on, to output a driving current. A first NLDMOS transistor NLD1 is turned on through a sixth AND gate AND6, a thirty-first NOT gate INV31, and a thirty-second NOT gate INV32, to increase the driving current. A reason for turning on the driving current in segments at this stage is the same as the turn-on stage.

At a S6 stage: when $V_{SW}$ starts rising, $V_{SW\_S}$_LS1 is a high level pulse signal, Flag1_LS is at a high level through a sixth latch Latch6, and the first NLDMOS transistor NLD1 is turned off, to reduce the driving current. When the driving current is reduced, a falling speed of the gate-source voltage Vgs1 of the first SiC MOSFET M1 is reduced. Therefore, the rising speed of $V_{SW}$ is reduced, that is, $dV_{SW}/dt$ is reduced. When $V_{SW}$ rises to VIN, $V_{SW\_S}$_LS2 is a high level pulse signal, after the second OR-NOT gate NOR2 and a twenty-seventh NOT gate INV27, an output signal Flag1_LS of the sixth latch Latch6 is at a low level, and the first NLDMOS transistor NLD1 is turned on again, to increase the driving current. A main issue is rising of $V_{SW}$ at this stage. The rising speed of $V_{SW}$ is reduced by reducing the falling speed of the gate-source voltage Vgs1 of the first SiC MOSFET M1.

At a S7 stage: when Flag1_LS1 is flipped to a low level, a third falling edge detection circuit works, so that an output end of a seventh latch Latch7 is at a high level until IN_LS is flipped from a low level to a high level, the output end is restored to a low level state. With the continuous rising of $V_{SW}$, a body diode of the second SiC MOSFET transistor M2 starts to be conducted forward, and Ids starts to reduce until being 0. A main issue is the reduction of Ids at this stage. A maximum driving current cannot be used for controlling $d_{Ids}/dt$.

At a S8 stage: when Ids is reduced to 0, $I_{ds\_S}$_LS is flipped from a high level to a low level, and a fourth falling edge detection circuit outputs a high level signal. Both two inputs of a third AND-NOT gate NAND3 are at a high level, and an output thereof is a low level signal. After a fifth AND gate AND5 and an eighth latch Latch8, Flag2_LS is at a high level, a third NLDMOS transistor NLD3 is turned on, to output a maximum driving current to rapidly reduce the gate-source voltage Vgs1 of the first SiC MOSFET M1 to VEE. The turn-off process of the SiC MOSFET is completed. FIG. 5 is a schematic diagram of key nodes.

In the turn-off segmented driving circuit, Flag2_LS depends on $I_{ds\_S}$_LS or Flag1_LS. This is because the source parasitic inductance of the SiC MOSFET is relatively small, when a speed of Ids is relatively small, the drain-source current sampling circuit of the SiC MOSFET may not work, Flag1_LS can still lift Flag2_LS after a specific delay, to increase the driving current. When IN_LS is flipped from a low level to a high level, Flag1_LS and Flag2_LS are restored to the low level signals, to prevent a logic error in a subsequent cycle caused by spurious triggering in a cycle. In the turn-off stage segmented driving circuit, the second NLDMOS transistor NLD2 outputs a minimum driving current, the first NLDMOS transistor NLD1 outputs a moderate driving current, and the third NLDMOS transistor NLD3 outputs a maximum driving current. Segmented driving is implemented by adjusting three different levels of driving current.

Figure 9:
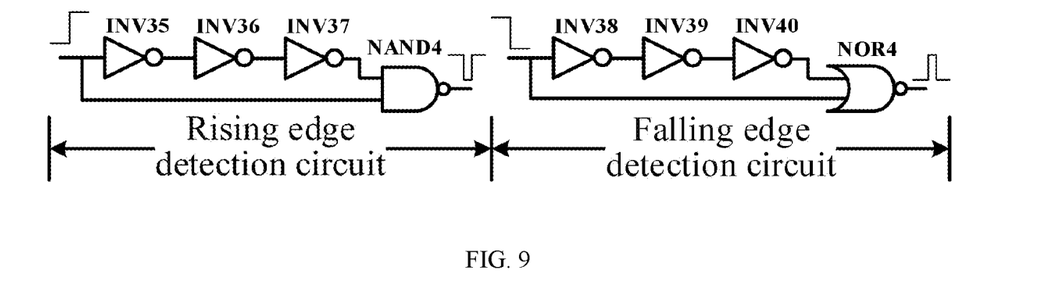
FIG. 9 is the edge detection circuit according to the present invention.

FIG. 9 is an edge detection circuit used in the circuit. The edge detection circuit mainly includes a rising edge detection circuit and a falling edge detection circuit. A working principle of the rising edge detection circuit is that: when an input signal is changed from a low level to a high level, one input end of a fourth AND-NOT gate NAND4 is at a high level. Due to delays of a thirty-fifth NOT gate INV35, a thirty-sixth NOT gate INV36, and a thirty-seventh NOT gate INV37, the other input end of the fourth AND-NOT gate NAND4 maintains a temporary high level. Therefore, the fourth AND-NOT gate NAND4 outputs a low level short pulse. Therefore, a rising edge signal is detected, and a low level short pulse signal is outputted. A working principle of the falling edge detection circuit is that: when an input signal is changed from a high level to a low level, one input end of a fourth OR-NOT gate NOR 4 is at a low level. Due to delays of a thirty-eighth NOT gate INV38, a thirty-ninth NOT gate INV39, and a fortieth NOT gate INV40, the other input end of the fourth OR-NOT gate NOR4 maintains a temporary low level. Therefore, the fourth OR-NOT gate NOR4 outputs a high level short pulse. Therefore, a falling edge signal is detected, and a high level short pulse signal is outputted.

The invention claimed is:

1. A multi-level gate driver applied to a SiC metal-oxide-semiconductor field-effect transistor (MOSFET), comprising: a SiC MOSFET information detection circuit, a signal level shifting circuit, and a segmented driving circuit, wherein the SiC MOSFET information detection circuit comprises a SiC MOSFET drain-source voltage detection circuit and a SiC MOSFET drain-source current detection circuit, the SiC MOSFET drain-source voltage detection circuit and the SiC MOSFET drain-source current detection circuit are respectively configured to perform sampling on information about a drain-source voltage of the SiC MOSFET and a drain-source current of the SiC MOSFET to obtain enable signals, the signal level shifting circuit is configured to transfer the enable signal for segmented driving to a level matching the segmented driving circuit and transmit the enable signal for segmented driving to the segmented driving circuit, and the segmented driving circuit comprises a turn-on segmented driving circuit and a turn-off segmented driving circuit and the segmented driving circuit is configured to drive the SiC MOSFET according to the enable signals for segmented driving, wherein the SiC MOSFET drain-source voltage detection circuit comprises a first NOT gate, a second NOT gate, a third NOT gate, a fourth NOT gate, a fifth NOT gate, a sixth NOT gate, a seventh NOT gate, an eighth NOT gate, a ninth NOT gate, a tenth NOT gate, an eleventh NOT gate, a twelfth NOT gate, a first AND gate, a second AND gate, a first Zener diode, a first Schottky diode, a second Zener diode, a second Schottky diode, a first latch, a second latch, a N-metal-oxide-semiconductor (NMOS) transistor, a P-metal-oxide-semiconductor (PMOS) transistor, a first delay circuit, a second delay circuit, a first rising edge detection circuit, a second rising edge detection circuit, a third rising edge detection circuit, a fourth rising edge detection circuit, a fifth rising edge detection circuit, a sixth rising edge detection circuit, a seventh rising edge detection circuit, an eighth rising edge detection circuit, a first falling edge detection circuit, a second falling edge detection circuit, and a level shifter, wherein an input end of the first NOT gate, an input end of the second NOT gate, an input end of the third NOT gate, and an input end of the fourth NOT gate are connected to the SiC MOSFET drain-source voltage detection circuit and a negative electrode of the first Zener diode, and a positive electrode of the first Zener diode is grounded; an output end of the first NOT gate is connected to an input end of the first rising edge detection circuit, and the first rising edge detection circuit outputs a first turn-on control signal; an output end of the second NOT gate is connected to an input end of the second rising edge detection circuit, and the second rising edge detection circuit outputs a second turn-on control signal; an output end of the third NOT gate is connected to an input end of the third rising edge detection circuit, and an output end of the fourth NOT gate is connected to an input end of the fifth NOT gate; an output end of the fifth NOT gate is connected to an input end of the fourth rising edge detection circuit, an output end of the fourth rising edge detection circuit is connected to an input end of the first delay circuit, an output end of the first delay circuit is connected to a first input end of the first AND gate, a second input end of the first AND gate is connected to an output end of the fifth rising edge detection circuit, an input end of the fifth rising edge detection circuit is connected to an output end of the sixth NOT gate, an input end of the sixth NOT gate is connected to an output end of the level shifter, and an input end of the level shifter is configured to receive a first driving input signal; an output end of the first AND gate is connected to an R input end of the first latch, an S input end of the first latch is connected to the output end of the first delay circuit, an output end of the first latch is connected to an input end of the seventh NOT gate, an output end of the seventh NOT gate is connected to a gate of the PMOS transistor, a source of the PMOS transistor is grounded, a drain of the PMOS transistor is connected to an anode of the first Schottky diode, and a cathode of the first Schottky diode is connected to the SiC MOSFET drain-source voltage detection circuit; an input end of the eighth NOT gate, an input end of the ninth NOT gate, an input end of the tenth NOT gate, and an input end of the twelfth NOT gate and an anode of the second Zener diode are connected to the SiC MOSFET drain-source voltage detection circuit, and a cathode of the second Zener diode is connected to a power supply; an output end of the eighth NOT gate is connected to the first falling edge detection circuit, and the first falling edge detection circuit outputs a first turn-off control signal; an output end of the ninth NOT gate is connected to the second falling edge detection circuit, and an output end of the second falling edge detection circuit outputs a second turn-off control signal; an output end of the tenth NOT gate is connected to an input end of the eleventh NOT gate, and an output end of the eleventh NOT gate is connected to the sixth rising edge detection circuit; an output end of the twelfth NOT gate is connected to an input end of the seventh rising edge detection circuit, an output end of the seventh rising edge detection circuit is connected to the second delay circuit, an output end of the second delay circuit is connected to a first input end of the second AND gate, a second input end of the second AND gate is connected to an output end of the eighth rising edge detection circuit, and an input end of the eighth rising edge detection circuit is configured to receive a second driving input signal; and an output end of the second AND gate is connected to an R input end of the second latch, an S input end of the second latch is connected to an output end of the sixth rising edge detection circuit, an output end of the second latch is connected to a gate of the NMOS transistor, a source of the NMOS transistor is grounded, a drain of the NMOS transistor is connected to a cathode of the second Schottky diode, and an anode of the second Schottky diode is connected to the SiC MOSFET drain-source voltage detection circuit;

the SiC MOSFET drain-source current detection circuit comprises a thirteen NOT gate, a fourteenth NOT gate, a fifteenth NOT gate, a sixteenth NOT gate, a seventeenth NOT gate, a Schmitt trigger, a third Zener diode, a fourth Zener diode, a third latch, a third AND gate, a ninth rising edge detection circuit, a tenth rising edge detection circuit, an eleventh rising edge detection circuit, and a divide-by-two circuit, wherein an input end of the thirteen NOT gate, an input end of the sixteenth NOT gate, an anode of the third Zener diode, and a cathode of the fourth Zener diode are connected to the SiC MOSFET drain-source current detection circuit, a cathode of the third Zener diode is connected to the power supply, and an anode of the fourth Zener diode is grounded; an output end of the thirteen NOT gate is connected to an input end of the fourteenth NOT gate, an output end of the fourteenth NOT gate is connected to a clock signal input end of the divide-by-two circuit, and a reset signal end of the divide-by-two circuit is connected to an output end of the third latch; an S input end of the third latch is connected to an output end of the ninth rising edge detection circuit, and an R input end of the third latch is connected to an output end of the tenth rising edge detection circuit; an input end of the ninth rising edge detection circuit is configured to receive a third driving input signal, and an input end of the tenth rising edge detection circuit is connected to an output end of the third AND gate; an output end of the divide-by-two circuit is connected to an input end of the eleventh rising edge detection circuit, an output end of the eleventh rising edge detection circuit is connected to an input end of the fifteenth NOT gate, an output end of the fifteenth NOT gate is connected to a first input end of the third AND gate, a second input end of the third AND gate is connected to the output end of the third latch, and the third AND gate outputs a third turn-on control signal; and an output end of the sixteenth NOT gate is connected to an input end of the Schmitt trigger, an output end of the Schmitt trigger is connected to an input end of the seventeenth NOT gate, and an output end of the seventeenth NOT gate outputs a third turn-off control signal;

the first turn-on control signal, the second turn-on control signal, the third turn-on control signal, the first turn-off control signal, the second turn-off control signal, the third turn-off control signal, and an externally inputted control signal form the enable signals for segmented driving, a signal level shifting circuit comprises an upward shifting and a downward shifting; and a first high-level turn-on control signal, a second high-level turn-on control signal, a third high-level turn-on control signal, a high-level externally inputted control signal, a first low-level turn-off control signal, a second low-level turn-off control signal, a third low-level turn-off control signal, and a low-level externally inputted control signal are obtained after the enable signals for segmented driving pass through the signal level shifting circuit;

the turn-on segmented driving circuit comprises an eighteenth NOT gate, a nineteenth NOT gate, a twentieth NOT gate, a twenty-first NOT gate, a twenty-second NOT gate, a twenty-third NOT gate, a twenty-fourth NOT gate, a twenty-fifth NOT gate, a twenty-sixth NOT gate, a first OR-NOT gate, a fourth AND gate, a first AND-NOT gate, a second AND-NOT gate, a fourth latch, a fifth latch, a first p-type lateral diffused metal oxide semiconductor (PLDMOS) transistor, a second PLDMOS transistor, a third PLDMOS transistor, and a twelfth rising edge detection circuit, wherein an input end of the nineteenth NOT gate is configured to receive the high-level externally inputted control signal, and an output end of the nineteenth NOT gate is connected to a first input end of the first OR-NOT gate and an R input end of the fifth latch; a second input end of the first OR-NOT gate is connected to an output end of the eighteenth NOT gate, and an output end of the first OR-NOT gate is connected to an R input end of the fourth latch; an input end of the eighteenth NOT gate is configured to receive the first high-level turn-on control signal; an S input end of the fourth latch is connected to an output end of the twelfth rising edge detection circuit, and an input end of the twelfth rising edge detection circuit is configured to receive the third high-level turn-on control signal; an input end of the twenty-second NOT gate is connected to an output end of the fourth latch, an output end of the twenty-second NOT gate is connected to a first input end of the first AND-NOT gate, a second input end of the first AND-NOT gate is connected to an output end of the twenty-first NOT gate, an output end of the first AND-NOT gate is connected to an input end of the twenty-third NOT gate, an output end of the twenty-third NOT gate is connected to an input end of the twenty-fourth NOT gate, an output end of the twenty-fourth NOT gate is connected to a gate of the first PLDMOS transistor, and a source of the first PLDMOS transistor is connected to the power supply; an S input end of the fifth latch is configured to receive the second high-level turn-on control signal, an output end of the fifth latch is connected to a first input end of the second AND-NOT gate, a second input end of the second AND-NOT gate is connected to an output end of the fourth AND gate, an output end of the second AND-NOT gate is connected to an input end of the twenty-fifth NOT gate, an output end of the twenty-fifth NOT gate is connected to an input end of the twenty-sixth NOT gate, an output end of the twenty-sixth NOT gate is connected to a gate of the third PLDMOS transistor, and a source of the third PLDMOS transistor is connected to the power supply; a first input end of the fourth AND gate is configured to receive the high-level externally inputted control signal, a second input end of the fourth AND gate is configured to receive a SiC MOSFET turn-on stage deadband signal, and the output end of the fourth AND gate is connected to an input end of the twentieth NOT gate; and an output end of the twentieth NOT gate is connected to an input end of the twenty-first NOT gate and a gate of the second PLDMOS transistor, and a source of the second PLDMOS transistor is connected to the power supply; and the turn-off segmented driving circuit comprises a twenty-seventh NOT gate, a twenty-eighth NOT gate, a twenty-ninth NOT gate, a thirtieth NOT gate, a thirty-first NOT gate, a thirty-second NOT gate, a thirty-third NOT gate, a thirty-fourth NOT gate, a second OR-NOT gate, a third OR-NOT gate, a third AND-NOT gate, a fifth AND gate, a sixth AND gate, a seventh AND gate, a sixth latch, a seventh latch, an eighth latch, a first n-type laterally diffused metal-oxide-semiconductor (NLDMOS) transistor, a second NLDMOS transistor, a third NLDMOS transistor, a third delay circuit, a third falling edge detection circuit, a fourth falling edge detection circuit, and a thirteenth rising edge detection circuit, wherein a first input end of the second OR-NOT gate is configured to receive the second low-level turn-off control signal, a second input end of the second OR-NOT gate is configured to receive the low-level externally inputted control signal, an output end of the second OR-NOT gate is connected to an input end of the twenty-seventh NOT gate, and an output end of the twenty-seventh NOT gate is connected to an R input end of the sixth latch; an S input end of the sixth latch is configured to receive the first low-level turn-off control signal, an output end of the sixth latch is connected to an input end of the third delay circuit, an input end of the third falling edge detection circuit, and an input end of the thirtieth NOT gate, an output end of the thirtieth NOT gate is connected to a first input end of the sixth AND gate, a second input end of the sixth AND gate is connected to an output end of the third OR-NOT gate, an output end of the sixth AND gate is connected to an input end of the thirty-first NOT gate, an output end of the thirty-first NOT gate is connected to an input end of the thirty-second NOT gate, an output end of the thirty-second NOT gate is connected to a gate of the first NLDMOS transistor, and a source of the first NLDMOS transistor is grounded; an input end of the thirteenth rising edge detection circuit is connected to an output end of the third delay circuit, an output end of the thirteenth rising edge detection circuit is connected to an input end of the twenty-eighth NOT gate, an output end of the twenty-eighth NOT gate is connected to a first input end of the fifth AND gate, a second input end of the fifth AND gate is connected to an output end of the third AND-NOT gate, a first input end of the third AND-NOT gate is connected to an output end of the seventh latch, and a second input end of the third AND-NOT gate is connected to an output end of the fourth falling edge detection circuit; an input end of the fourth falling edge detection circuit is configured to receive the third low-level turn-off control signal; an S input end of the seventh latch is connected to an output end of the third falling edge detection circuit, and an R input end of the seventh latch is configured to receive the low-level externally inputted control signal; an output end of the fifth AND gate is connected to an S input end of the eighth latch, an R input end of the eighth latch is connected to an output end of the twenty-ninth NOT gate, and an input end of the twenty-ninth NOT gate is configured to receive a low-level externally outputted control signal; a first input end of the seventh AND gate is connected to an output end of the eighth latch, a second input end of the seventh AND gate is connected to the output end of the third OR-NOT gate, an output end of the seventh AND gate is connected to an input end of the thirty-third NOT gate, an output end of the thirty-third NOT gate is connected to an input end of the thirty-fourth NOT gate, an output end of the thirty-fourth NOT gate is connected to a gate of the third NLDMOS transistor, and a source of the third NLDMOS transistor is grounded; a gate of the second NLDMOS transistor is connected to the output end of the third OR-NOT gate, and a source of the second NLDMOS transistor is grounded; and a drain of the first PLDMOS transistor, a drain of the second PLDMOS transistor, a drain of the third PLDMOS transistor, a drain of the first NLDMOS transistor, a drain of the second NLDMOS transistor, and a drain of the third NLDMOS transistor are connected as an output end of a segmented driving circuit.

* * * * *